(12) United States Patent
Kamath

(10) Patent No.: US 10,557,884 B2
(45) Date of Patent: Feb. 11, 2020

(54) WIRE BREAK DETECTION IN DIGITAL INPUT RECEIVERS

(71) Applicant: TEXAS INSTRUMENTS INCORPORATED, Dallas, TX (US)

(72) Inventor: Anant Shankar Kamath, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 169 days.

(21) Appl. No.: 15/832,968

(22) Filed: Dec. 6, 2017

(65) Prior Publication Data

US 2018/0328973 A1 Nov. 15, 2018

Related U.S. Application Data

(60) Provisional application No. 62/504,992, filed on May 11, 2017.

(51) Int. Cl.
*G01R 31/00* (2006.01)
*G01R 31/02* (2006.01)
*H03K 17/795* (2006.01)

(52) U.S. Cl.
CPC ....... *G01R 31/026* (2013.01); *H03K 17/7955* (2013.01)

(58) Field of Classification Search
USPC .......... 324/537, 538, 713, 73.1; 330/285
See application file for complete search history.

(56) References Cited

U.S. PATENT DOCUMENTS

| 4,596,984 | A | * | 6/1986 | Egami | .................. | H03K 17/002 307/117 |
| 7,705,741 | B2 | | 4/2010 | Picard | | |
| 2005/0080493 | A1 | | 4/2005 | Arntson | | |
| 2005/0139791 | A1 | * | 6/2005 | Breinlinger | ........ | H03K 17/7955 250/551 |
| 2014/0312909 | A1 | | 10/2014 | Alley | | |

OTHER PUBLICATIONS

International Search Report in corresponding PCT Application No. PCT/US2018/031553, dated Aug. 16, 2018 (2 pages).

* cited by examiner

*Primary Examiner* — Vincent Q Nguyen
(74) *Attorney, Agent, or Firm* — John R. Pessetto; Charles A. Brill; Frank D. Cimino

(57) ABSTRACT

An optocoupler is placed in series between the field ground pin of digital input circuitry and the field ground of an industrial controller. A capacitor to field ground is provided for each digital input. A resistor is provided to the input pin of the digital input circuitry. To detect a broken wire a test pulse is provided to the optocoupler connected in the ground path. This test pulse isolates the digital input circuitry from field ground. As current is always being provided from the field when the wire is not broken, the capacitor connected between the input and ground charges. After the test pulse has completed, the output signal of the digital input circuitry is examined. If the level indicates the input is high, the wire is not broken. If, however, the output remains low indicating that the input is low, the wire has broken.

4 Claims, 6 Drawing Sheets

WIRE BREAK DETECTION IN DIGITAL INPUT RECEIVERS

CROSS REFERENCE TO RELATED APPLICATIONS

This application claims the benefit under 35 U.S.C. § 119(e) of U.S. Provisional Patent Application Ser. No. 62/504,992 entitled "Wire Break Detection in Digital Input Receivers" filed May 11, 2017, which is hereby incorporated by reference as if reproduced in its entirety.

BACKGROUND

1. Field

The field is industrial controls, and more specifically, to digital input logic circuitry used in industrial controls.

2. Description of the Related Art

In an industrial plant environment it is common to have various switches and sensors provide inputs for a control process. The switches and sensors are wired to digital inputs of industrial controllers, commonly known as programmable logic controllers. As the wires have to traverse an industrial plant environment, breakage of the wire is expected, if not common. When the wire is broken, the industrial controller believes that the respective digital input is a logic low-level, even though the actual input level may be high because the switch is closed or the sensor is activated. Therefore it is desirable to be able to easily determine when a wire from a switch or sensor to the industrial controller is broken.

This detection can be readily performed when the digital input circuitry includes field-side power but such circuitry is more complicated, and therefore more expensive, and thus not used widely. The more common digital input circuitry used in industrial controllers draws current from the particular sensors and switches on the input or field side. In general, a DC voltage is provided to the sensor or switch, so that when the sensor or switch is in a closed position, the voltage is provided to the digital input circuitry. To provide power from the sensors or switches when the sensor or switch is open, a resistor is provided in parallel to the switch or sensor contacts to provide a low current path. Unlike the digital input circuitry that includes field-side power, the digital input circuitry that is input powered cannot determine when a wire is broken. Therefore, the designer is left with a quandary of using more expensive, complicated and undesirable field-side power providing digital input circuitry or losing the ability to detect broken wires. Therefore it is desirable to be able to detect broken wires while utilizing the more desirable and simpler input-powered digital input circuitry.

SUMMARY

Examples allow the use of simpler field-powered digital input circuitry and yet provide the capability to detect broken wires. In an example, an optocoupler is placed in series between the field ground pins of the digital input circuitry and the field ground of the industrial controller. A capacitor to field ground is provided for each digital input of the industrial controller. A resistor is provided from the input of the industrial controller to the input pin of the digital input circuitry. In operation, to detect a broken wire a test pulse is provided from the industrial controller microcontroller to the optocoupler connected in the ground path. This test pulse isolates the digital input circuitry from field ground. As current is always being provided from the field when the wire is not broken, either at full voltage when the switch or sensor is closed or a small current using a bypass resistor when the switch or sensor is open, the digital input circuitry being disconnected from ground allows the capacitor connected between the input and ground to charge. The charge rate is controlled by various resistors, both the bypass resistor and any resistors between the digital input circuitry input and the industrial controller input. After the test pulse has completed, the microcontroller examines the output signal of the digital input circuitry to monitor its level of high or low. If the level indicates the input is high, this is an indication that the wire is not broken. If, however, the output of the digital input circuitry remains low indicating that the input is low, this is an indication that the wire from the sensor or switch has broken. In this simple manner the more desirable input-powered digital input circuitry can be used and yet wire break detection is available.

BRIEF DESCRIPTION OF THE FIGURES

For a detailed description of various examples, reference will now be made to the accompanying drawings in which.

DETAILED DESCRIPTION OF THE EXAMPLES

Figure 1:
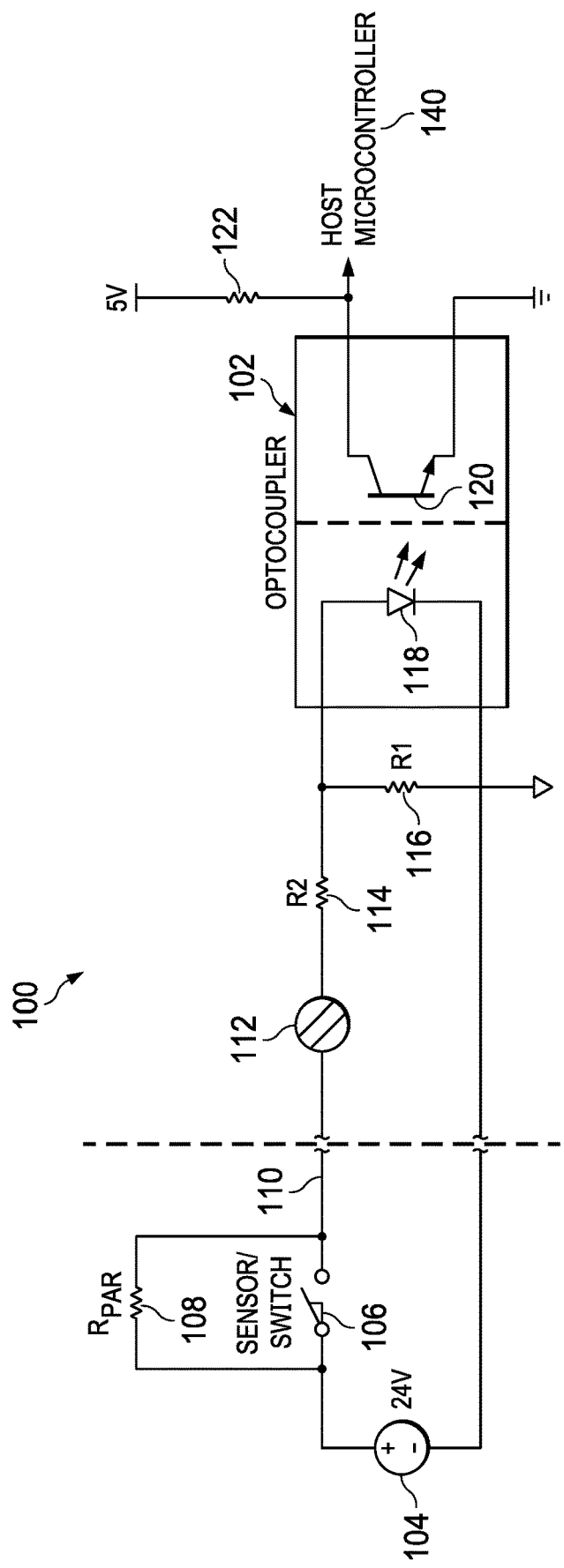
FIG. 1 is a block diagram of a simple design of a digital input controller connected to a sensor or switch.

Referring now to FIG. 1, a digital input circuit 100 of an industrial controller according to the prior art is shown. An optocoupler 102 is the active element in the circuit 100. A voltage source 104, such as a 24 V supply, is provided in the industrial environment, in the field, to provide a power source for the digital input circuit 100. A sensor or switch 106 is connected to the voltage source 104, with a resistor 108 connected in parallel to the sensor or switch 106. A field input wire no is provided from the sensor or switch 106 and resistor 108 to a field input terminal 112 of the industrial controller. Resistors 114 and 116 are provided for current limit and protection purposes. A photodiode 118 of the optocoupler 102 is connected so that when the sensor or switch 106 is in a closed position, current flows from the voltage source 104 to the sensor or switch 106, through the resistor 114 and through the photodiode 118. When this happens, the photodiode 118 emits light and activates a phototransistor 120. The emitter of the phototransistor 120 is connected to ground and the collector is pulled up to a logic level, such as 5 V, by a resistor 122. The collector of the phototransistor 120 is provided to a logic input of the host microcontroller 140 of the industrial controller as the digital input value. From this circuit 100 it is apparent that if the wire no is broken, the photodiode 118 is never powered and therefore the output of the digital input circuit 100 is always a high level, as the phototransistor 120 is never activated to pull down the output signal. Therefore the operator of the industrial plant is not able to determine if the sensor or switch 106 is always open or if the wire no is broken.

Figure 2:
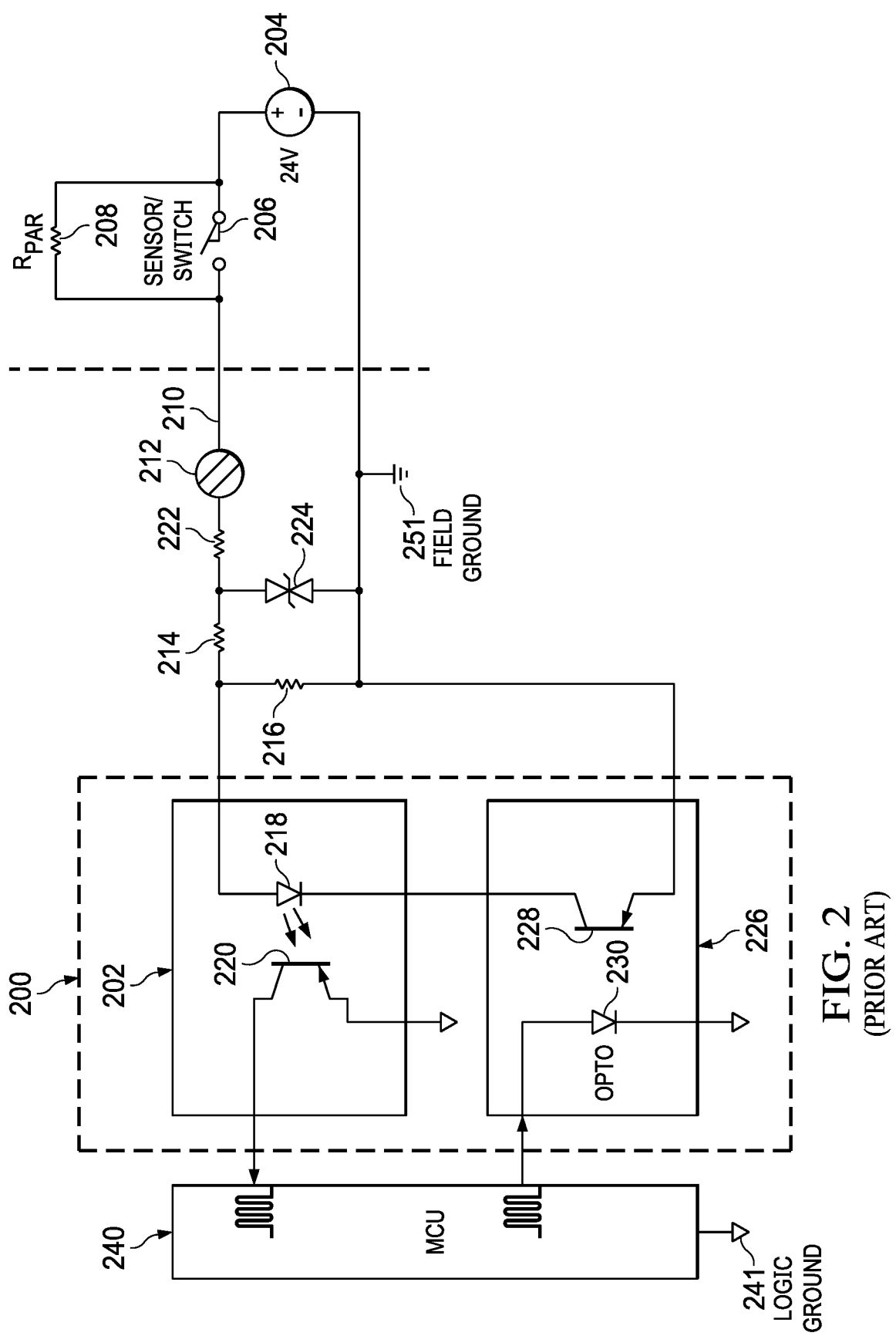
FIG. 2 is a block diagram of an alternative design of digital input circuitry.

Referring now to FIG. 2, a prior art digital input circuit 200 is illustrated which allows determination of an output signal at a low condition, indicating failure of the optocoupler. In general many of the components are similar to those shown in FIG. 1 and use an element number where the first digit is replaced by a two. A voltage source 204 provides voltage to a sensor or switch 206 and a parallel resistor 208. A field input wire 210 connects the sensor/switch 206 and resistor 208 to the field input terminal 212. A protection resistor 222 is provided from the field input terminal 212 to the resistor 214. The junction point between the resistor 222 and resistor 214 receives one side of a protection diode 224, which is also connected to ground. The anode of a photodiode 218 is connected to resistor 214. A resistor 216 is connected from the resistor 214 to field ground 251. The cathode of the photodiode 218 is connected to the collector of a phototransistor 228 in an optocoupler 226. The emitter of the phototransistor 228 is connected to field ground. A photodiode 230 of the optocoupler 226 has its cathode connected to logic ground 241 and the anode connected to a logic output of the microcontroller 240, with the microcontroller 240 also connected to logic ground. The collector of a phototransistor 220 in the optocoupler 202 is connected to an input of the microcontroller 240.

In operation, a pulse train is provided by the microcontroller 240 to the photodiode 230. This causes the phototransistor 228 to open and close, so that the photodiode 218 is allowed to conduct to ground and alternatively is not allowed to conduct ground. Under this condition the phototransistor 220 should provide a waveform to the microcontroller 240 similar to the waveform being provided from the microcontroller 240, but inverted. If the waveforms are similar, then the digital input circuit 200 is not stuck at zero but is operable. If, however, the input to the microcontroller 240 never varies and is always low, then the optocoupler 202 is stuck at zero and has failed.

Figure 3:
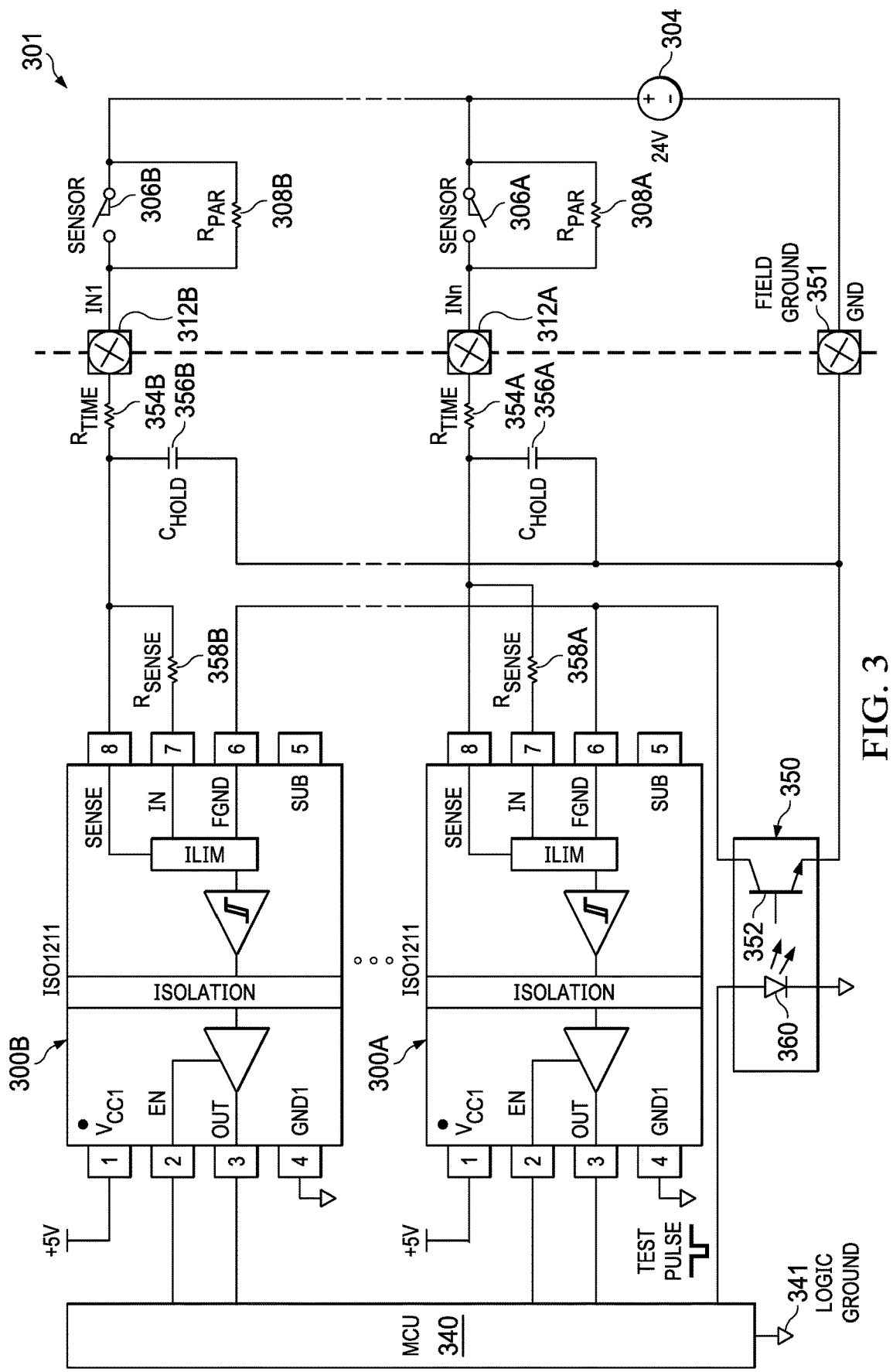
FIG. 3 is a block diagram of a first example of an industrial controller including a series of digital inputs and circuitry used to allow wire break detection.

Referring now to FIG. 3, an example illustrated. Industrial controller 301 is illustrated. As before, like components have the hundreds digit changed. Two digital input circuits 300A and 300B are illustrated. A voltage source 304 provides voltage to the field. A switch 306A and parallel resistor 308A are connected from the voltage source 304 to one field input terminal 312A. Similarly, a sensor 306B and parallel resistor 308B are connected from the voltage source 304 to a field input terminal 312B. In the example of FIG. 3, rather than being an optocoupler as shown in FIGS. 1 and 2, the digital input circuits 300A and 300B use high frequency carrier modulation across a silicon dioxide-based isolation barrier to provide the capacitive isolation between the field and the industrial controller 301. An example of such a device is the ISO$_{1211}$ Isolated 24-V to 60-V Digital Input Receiver for Digital Input Module provided by Texas Instruments®. Familiarity with the data sheet of the ISO$_{1211}$ is helpful as this description references the pins of an ISO$_{1211}$.

An optocoupler 350 is provided in the industrial controller 301. The emitter of a phototransistor 352 in the optocoupler 350 is connected to a field ground terminal 351. The collector of the phototransistor 352 is connected to the field ground pins of the digital input circuits 300A and 300B. With this connection of the two digital input circuits 300A, 300B to the single optocoupler 350, the digital input circuits 300A, 300B should include reverse current blocking to prevent charging through other pins.

A threshold resistor 354A, 354B is connected to the field input terminal 312A, 312B. The other end of the threshold resistor 354A, 354B is connected to the sense input of the digital input circuit 300A, 300B; to one terminal of a hold capacitor 356A, 356B and to one end of a current limit resistor 358A, 358B. The second side of the hold capacitor 356A, 356B is connected to field ground. The second end of the current limit resistor 358A, 358B is connected to the input pin of the digital input circuit 300A, 300B. The V$_{CC}$ input of the digital input circuit 300A, 300B is connected to a voltage source such as 5 V. The logic output pin of the digital input circuit 300A, 300B is connected to a logic input of a microcontroller 340, so that the logic value at the field input terminal 312A, 312B is provided to the microcontroller 340 for use in controlling the industrial process, in contrast to the optocouplers of FIGS. 1 and 2 which invert the input signal at the output. The enable input of the digital input circuit 300A, 300B is also connected to the microcontroller 340 in the illustrated example. It is understood that in many designs the enable inputs and the outputs of the digital input circuits would be coupled to the microcontroller 340 through latches and buffers, rather than being directly connected as illustrated. The anode of a photodiode 360 in the optocoupler 350 is connected to an output of the microcontroller 340. The cathode of the photodiode 360 is connected to digital or logic ground 341. This connection of the photodiode 360 allows the microcontroller 340 to control the state of the phototransistor 352, so that the field ground to the digital input circuit 300A, 300B can be removed if desired. It is understood that the microcontroller 340 includes random access memory and non-volatile memory, such as flash memory, either internally or externally. The non-volatile memory stores programs executed by the microcontroller 340 to perform its various functions, including testing for broken input wires.

To determine a broken wire to an input, a test pulse, a low going pulse, is provided to the photodiode 360 by a logic output of the microcontroller 340, the signal to the photodiode 360 normally being a high voltage. This test pulse causes the field ground pin of the digital input circuit 300A, 300B to be decoupled or disconnected. This allows the hold capacitor 356A, 356B to develop a voltage if current is being provided from the field.

Figure 4:
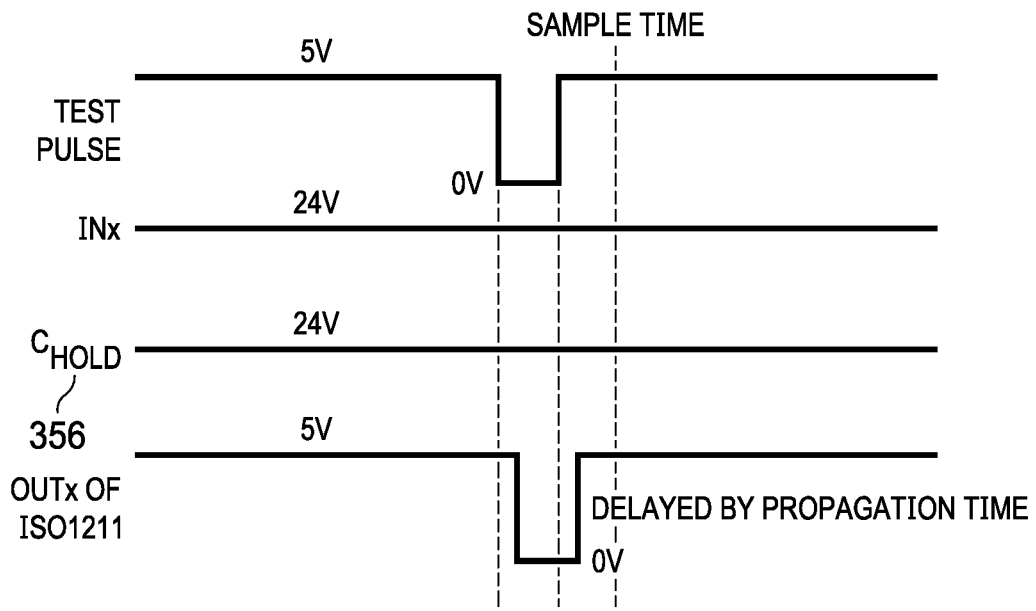
FIG. 4 is a timing diagram of operation of the example of FIG. 3 and the input signal to the industrial controller is high.

FIG. 4 illustrates the case where the input signal is high, as the relevant switch or sensor is closed, and the wire is not broken. The test pulse is provided for a given period to allow the hold capacitor 386 to charge, as described below. The input voltage is high, in the example 24 V, and the voltage of the hold capacitor 356 is also high or 24 V. As the digital input circuit 300A, 300B is non-inverting, the output of the digital input circuit 300A, 300B is then a delayed version of the test pulse. The microcontroller 340 then samples the output of the digital input circuit 300A, 300B slightly after the completion of the test pulse, as indicated by the sample time line. In FIG. 4 the output is a high level, which could not occur in a broken wire situation with the ISO$_{1211}$ as the digital input circuit. Therefore the conclusion of FIG. 4 is that the wire is not broken.

Figure 5:
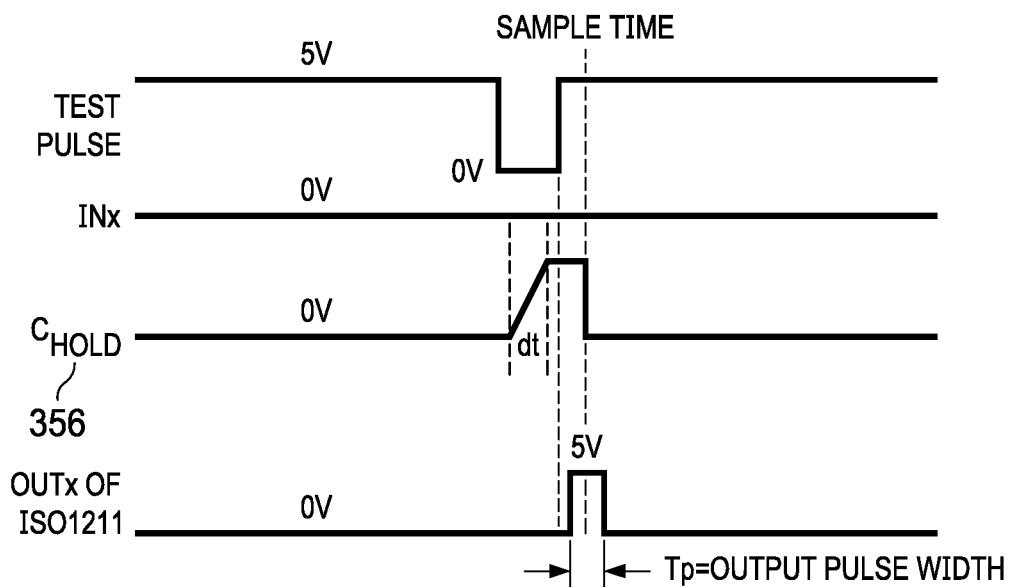
FIG. 5 is a timing diagram of operation of the example of FIG. 3 when the input signal to the industrial controller is low.

FIG. 5 illustrates operation when the input signal is in a low or 0 V condition. The test pulse is provided to the photodiode 360 and the field ground is removed from the digital input circuit 300A, 300B. Even though the input signal is at a zero voltage, the field current is still drawn when the wire is not broken. Even though the field current is in the microampere range, the hold capacitor 356 charges because of the removal of the field ground from the digital input circuit 300A, 300B. The size of the hold capacitor 356 can be determined based on the digital input circuitry input, high state current, the field voltage, the digital input circuitry low threshold voltage and the defined output pulse width. With the hold capacitor 356 size then determined, the test pulse width can be determined based on the capacitor size, the field input current where low, and the field voltage. The equations are provided here.

dt=min width of Test pulse needed $$dt = C_{356} * \Delta V_1 / I_{INo}, \text{ where,}$$

$\Delta_1$=24V (to charge from 0 to 24V)
$I_{INo}$=Minimum low current possible in low state (depends on field transmitter)
Tp=Smallest output pulse width.

$$Tp = C_{356} * \Delta V_2 / I_{IN_1}, \text{ where,}$$

$\Delta V_2$=24V−7V (7V is the value of low-threshold, VIL)
$I_{IN_1}$=Max high current from $ISO_{1211}$ (2.7 mA at 24V)
Table 1 provides various example values using the $ISO_{1211}$ and a 24V field voltage.

TABLE 1

| $I_{INo}$ | $C_{356}$ | dt | Tp |
|---|---|---|---|
| 100 uA | 10 nF | 2.4 ms | 63 us |
| 100 uA | 100 pF | 24 us | 630 ns |
| 500 uA | 10 nF | 0.48 ms | 63 us |
| 500 uA | 100 pF | 4.8 us | 630 ns |

Sampling the output of the digital input circuit 300A, 300B by the microcontroller 340 slightly after the completion of the test pulse, at the sample time, results in a high voltage reading because of the voltage that has developed across the hold capacitor 356. When the photodiode 360 is again activated, this causes the phototransistor 352 to become active and connect the field ground pins of the digital input circuits 300A, 300B to field ground, at which time the hold capacitor 356 discharges based on the value of the resistor 358 and the current at the high state of the digital input circuitry input. By properly selecting the various values, the voltage on the hold capacitor 356 remains high long enough to be seen as a high value at the sample time after the test pulse. As with the example of FIG. 4, the high value of the output of the digital input circuit 300A, 300B at the sample time indicates that the wire is not broken.

Figure 6:
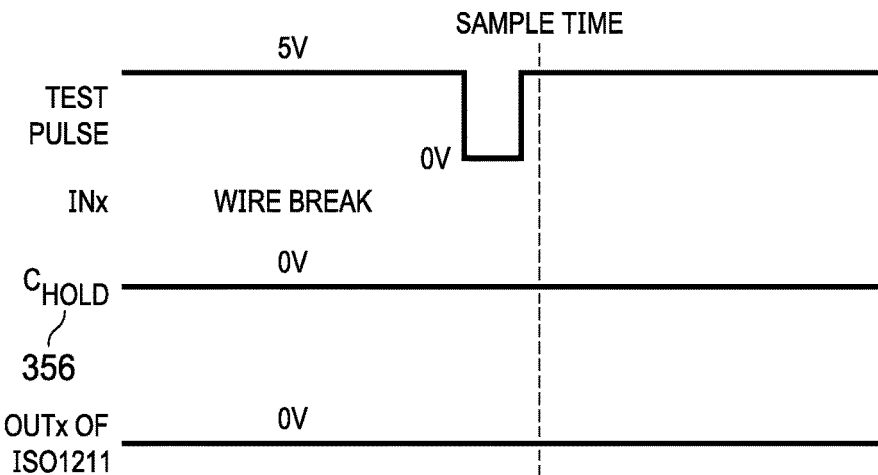
FIG. 6 is a timing diagram of operation of the example of FIG. 3 when the wire to the input of the industrial controller is broken.

FIG. 6 illustrates operation when the wire is broken. As before, a test pulse is provided to the photodiode 360. This causes, as in the case of shown in FIG. 5, the ground to be removed from the digital input circuit 300A, 300B, which would allow the hold capacitor 356 to be charged. However, because the wire is broken, no field current is provided to the hold capacitor 356 and therefore the hold capacitor 356 remains at a low or zero voltage. When sampling of the output of the digital input circuit 300A, 300B is performed by the microcontroller 340 slightly after the completion of the test pulse at the sample time, the output of the digital input circuit 300A, 300B is low or zero. This is the indication that the wire has been broken.

Therefore in either case of the wire being connected, the input high or the input low, the output value of the digital input circuit 300A, 300B is a high level at the sample time after the completion of the test pulse. However, the output of the digital input circuit 300A, 300B is low if the wire is broken.

Figure 7:
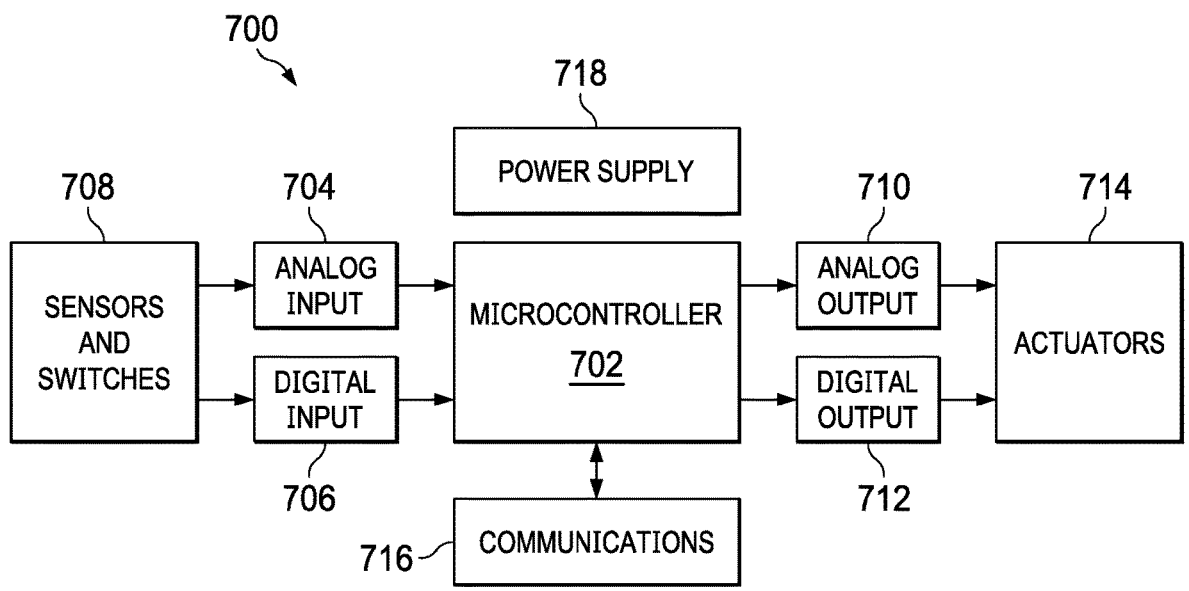
FIG. 7 is a block diagram of a typical industrial controller.

FIG. 7 is a block diagram of a typical industrial controller or programmable logic controller 700. A microcontroller 702 provides the intelligence in the industrial controller 700. Analog inputs 704 and digital inputs 706 are connected to the microcontroller 702. Analog inputs 704 and digital inputs 706 receive their inputs from various sensors and switches 708 located in the environment in the field. The microcontroller 702 provides outputs to analog outputs 710 and digital outputs 712. The analog outputs 710 and the digital outputs 712 are connected to actuators 714 connected in the field to operate mechanisms as required to control the desired process. A communications module 716 is connected microcontroller 702 and is interconnected to other industrial controllers and is provided for programming purposes of the microcontroller 702. A power supply 718 provides power to the industrial controller 700 generally. It is understood that this is a very simplistic illustration of an industrial controller for explanation purposes and that the industrial controller can have many different architectures The microcontroller 702 includes flash memory containing software to manage the industrial controller 700 to manage the desired process. The software also provides a user input mechanism to indicate the desire to perform the broken wire testing, to provide the test pulse and to sample the digital input circulatory output at the sample time. The broken wire testing can be performed periodically, on a schedule set by a user, or on demand as requested by the user.

Figure 8:
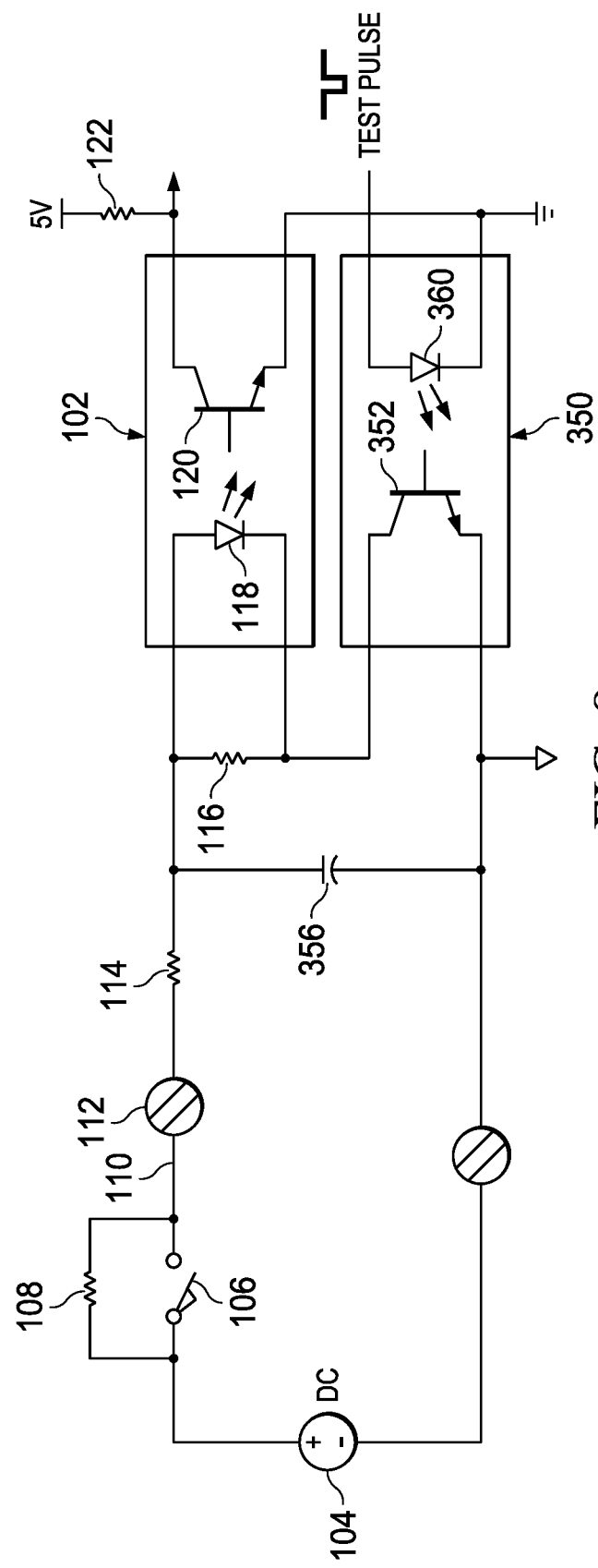
FIG. 8 is a block diagram of a modified version of the circuit of FIG. 1 to form a second example.

FIG. 8 is the prior art optocoupler example of FIG. 1 modified to include an optocoupler and capacitor to form a second example. Like elements include the element numbers from the prior relevant figure. The optocoupler 350 has the collector of the phototransistor 352 connected to the cathode of the photodiode 118 and the resistor. The emitter of the phototransistor 352 is connected to field ground. The hold capacitor 356 is added between the input and field ground. For simplicity the reverse current blocking components have been omitted from FIG. 8. The test pulse is provided to the mode of the photodiode 360 to perform wire break testing.

The equations to determine the hold capacitor 356 size are similar to those provided above, except that the high level input current must be large enough to activate the photodiode 118 and consideration of the resistor 116 must be included.

In the illustrated examples an optocoupler 350 has been used as an isolator to disconnect the digital input circuitry from field ground. It is understood that other components can be used in the place of the optocoupler, such as solid state relays, passive input isolators, digital isolators and the like. In most cases the component has an open collector or open drain output stage and has an output current handling capacity large enough for the digital input circuitry requirements. Thus the components have two signal inputs and two signal outputs. In one state of the inputs, the outputs are connected so that current can flow through the outputs, the voltage between the emitter and collector or drain and source being nominal in such a condition. In the other state of the inputs, the outputs are disconnected, so that current cannot flow through the outputs. When used in the disclosed examples, the inputs would be connected to digital ground and the microcontroller output and the outputs would be connected to field ground and the field ground pins of the digital input circuitry.

The illustrated examples have used the $ISO_{1211}$ Isolated Digital Input Receiver and optocouplers as the example digital input circuits. It is understood that various other components which provide isolation between the field and logic sides could be utilized, such as solid state relays, passive input isolators, digital isolators and the like as known to those skilled in the art.

The illustrated examples have shown the digital input circuitry and the optocoupler as separate devices. It is understood that the digital input circuitry and the optocoupler could be integrated into a single device. In such a single device, the connection between the digital input circuit field ground and the phototransistor collector would be internal, the field ground of the single device connecting to the emitter of the phototransistor. The single device would have an input for the anode of the photodiode, with the cathode of the photodiode connected to the logic ground internally. Therefore the single device would have one additional pin over the digital input circuit alone, the input for the photodiode.

By adding an optocoupler between the field ground pin and field ground and a hold capacitor between the input and field ground, a test pulse can be used to determine if the wire from a switch or sensor is broken. This allows use of simple input-powered digital input circuitry and still have the ability to test for broken wires.

The above description is intended to be illustrative, and not restrictive. For example, the above-described examples may be used in combination with each other. Many other examples will be apparent upon reviewing the above description. The scope should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A controller comprising:
   a field input terminal for connecting to a field input wire, the field input wire carrying a current when not broken;
   a field ground terminal;
   a microcontroller having a logic input and a logic output wherein the microcontroller is connected to logic ground;
   a digital input circuit having a field input, a field ground, a logic output and a logic ground wherein the field input is coupled to the field input terminal and the logic output is coupled to the microcontroller;
   a capacitor connected between the field input terminal and the logic ground; and
   an isolator having a first signal input coupled to the microcontroller logic output, a second signal input coupled to the logic ground, a first field output and a second field output connected to the field ground terminal, wherein when the first signal input is in a first state, the first field output is connected to the field ground and when the first signal input is in a second state, the first field output is disconnected from the field ground;
   wherein the microcontroller includes a second logic input, the controller further comprising:
   a second field input terminal for connecting to a second field input wire, the second field input wire carrying a current when not broken;
   a second digital input circuit having a field input coupled to the second field input terminal, a field ground, a logic output coupled to the microcontroller second logic input and a logic ground; and
   a second capacitor connected between the second field input terminal and the field ground terminal,
   wherein the second digital input circuit field ground is connected to the isolator first field output.

2. The controller of claim 1, wherein the digital input circuit and the second digital input circuit each include reverse current blocking.

3. A digital input for a controller, the controller including a field input terminal for connecting to a field input wire, the field input wire carrying a current when not broken, a field ground terminal and a microcontroller having a logic input, a logic output wherein the microcontroller is connected to logic ground, the digital input comprising:
   a digital input circuit having a field input for coupling to the field input terminal, a field ground, a logic output for coupling to the microcontroller logic input and a logic ground;
   an isolator having a first signal input for coupling to the microcontroller logic output, a second signal input for coupling to logic ground, a first field output connected to the digital input circuit field ground and a second field output for connecting to the field ground terminal, wherein when the first signal input is in a first state, the first field output is effectively connected to the second field output and when the first signal input is in a second state, the first field output is disconnected from the second field output; and
   a capacitor connected between the digital input circuit field input and the isolator second field output;
   wherein the microcontroller includes a second logic input and the controller includes a second field input terminal for connecting to a second field input wire, the second field input wire carrying a current when not broken, the digital input further comprising:
   a second digital input circuit having a field input for coupling to the second field input terminal, a field ground, a logic output for coupling to the microcontroller second logic input and a logic ground; and
   a second capacitor connected between the second digital input circuit field input and the isolator second field output,
   wherein the second digital input circuit field ground is connected to the isolator first field output.

4. The digital input of claim 3, wherein the digital input circuit and the second digital input circuit each include reverse current blocking.

* * * * *